United States Patent [19]

Rameshani et al.

[11] Patent Number: 4,839,700
[45] Date of Patent: Jun. 13, 1989

[54] SOLID-STATE NON-VOLATILE ELECTRONICALLY PROGRAMMABLE REVERSIBLE VARIABLE RESISTANCE DEVICE

[75] Inventors: Rajeshuni Rameshani; Sarita Thakoor, both of Pasadena; Taher Daud, La Crescenta; Aniklumar P. Thakoor, Pasadena, all of Calif.

[73] Assignee: California Institute of Technology, Pasadena, Calif.

[21] Appl. No.: 133,897

[22] Filed: Dec. 16, 1987

[51] Int. Cl.$^4$ .................. H01L 45/00; H01L 27/12; H01L 49/02; H01L 29/12
[52] U.S. Cl. .......................... 357/2; 357/4; 357/6; 357/10; 357/54; 350/357
[58] Field of Search ............... 357/2, 4, 6, 10, 54; 350/357

[56] References Cited

U.S. PATENT DOCUMENTS

| | | | |
|---|---|---|---|
| Re. 28,199 | 10/1974 | Deb et al. | 350/357 |
| 3,521,941 | 9/1970 | Deb et al. | 350/357 |
| 3,748,501 | 7/1973 | Fritzsche et al. | 357/2 |
| 4,187,530 | 2/1980 | Singh et al. | 357/2 |
| 4,317,686 | 3/1982 | Anand et al. | 357/91 |

Primary Examiner—J. Carroll
Attorney, Agent, or Firm—Ashen Golant Martin & Seldon

[57] ABSTRACT

A solid-state variable resistance device (10) whose resistance can be repeatedly altered by a control signal over a wide range, and which will remain stable after the signal is removed, is formed on an insulated layer (14), supported on a substrate (12) and comprises a set of electrodes (16a, 16b) connected by a layer (18) of material, which changes from an insulator to a conductor upon the injection of ions, covered by a layer (22) of material with insulating properties which permit the passage of ions, overlaid by an ion donor material (20). The ion donor material is overlaid by an insulating layer (24) upon which is deposited a control gate (26) located above the contacts. In a preferred embodiment, the variable resistance material comprises $WO_3$, the ion donor layer comprises $Cr_2O_3$, and the layers sandwiching the ion donor layer comprise silicon monoxide. When a voltage is applied to the gate, the resistance between the electrode contacts changes, decreasing with positive voltage and increasing with negative voltage.

35 Claims, 1 Drawing Sheet

SOLID-STATE NON-VOLATILE ELECTRONICALLY PROGRAMMABLE REVERSIBLE VARIABLE RESISTANCE DEVICE

The invention described herein was made in the performance of work under a NASA contract, and is subject to the provisions of Public Law 96-517 (35 U.S.C. 202) in which the Contractor has elected to retain title.

TECHNICAL FIELD

The present invention relates broadly to electronic memories based on neural networks, and, more particularly, to a programmable reversible variable resistance device used in such networks.

BACKGROUND ART

Neural network models offer a totally new approach to intelligent information processing that is robust, fault tolerant, and can be extremely fast. These features originate directly from the massive interconnectivity of neurons (the decision-making elements) in the brain and its ability to store information in a distributed manner as a large number of synaptic interconnects of varying strengths. Hardware implementations of neural net concepts, therefore, are attracting considerable attention. Such artificial neural networks are expected, for example, to function as high speed, content addressable, associative memories in large knowledge bases for artificial intelligence applications and robotics or to perform complex computational tasks such as combinatorial optimization for autonomous systems.

Non-volatile, associative electronic memories based upon neural network models, with dense synaptic interconnection arrays in thin-film form, have recently been developed, using hydrogenated amorphous silicon (a-SiH) and manganese dioxide ($MnO_2$). Irreversible memory switching in hydrogenated amorphous silicon (OFF→ON) and manganese dioxide (ON→OFF) makes them ideally suited for use as programmable, binary, weak synaptic connections in associative programmable read-only-memories (PROMs) based on neural networks models. Although successful, it would be highly desireable to obtain the equivalents of erasable PROMs (EPROMs), such that the switching state can be reversed when desired (ON←→OFF←→ON etc.). A further desireable feature would be to obtain control over the non-volatile resistance value so as to obtain any desired intermediate value.

In addition to the binary, non-volatile resistive stable states, if the device provides a continuous (analog) control over its non-volatile (resistance) value, it would form an ideal component (element) for a variety of non-volatile control operation in adaptive (feedback) circuitry. Furthermore, as a synapse in electronic (artificial) neural networks, it would provide an additional "dimension" for analog information storage and processing.

DISCLOSURE OF INVENTION

In accordance with the invention, a gate-controlled variable resistance device with memory is provided, based on a material which controllably changes from an insulator to a conductor upon the injection of ions from an ion donor material.

In particular, a solid state, non-volatile electrically progammable reversible variable resistance device comprises:

(a) a pair of electrodes formed on an insulating surface;

(b) a layer of a variable resistance material having a controllable resistivity by adjusting ionic content thereof and physically contacting the pair of electrodes;

(c) a layer of an ion donor material for adjusting the ion content of the variable resistance material; and (d) a gate electrode for generating an electric field to control flow of ions into or out of the ion donor material.

Non-linear blocking barrier layers may be interposed between the layer of variable resistance material and the layer of ion donor material and between the layer of ion donor material and the gate electrode.

The resistance of the solid-state resistance device of the invention (as measured between the pair of electrodes) can be repeatedly altered by a control signal over a wide range, and will remain stable after the signal is removed. The field generated by the gate controls the flow of ions, such as hydrogen ions, between the ion donor material and the variable resistance material. The ions react with the variable resistance material to produce a material having a reduced resistance.

BEST MODES FOR CARRYING OUT THE INVENTION

Figure 1:
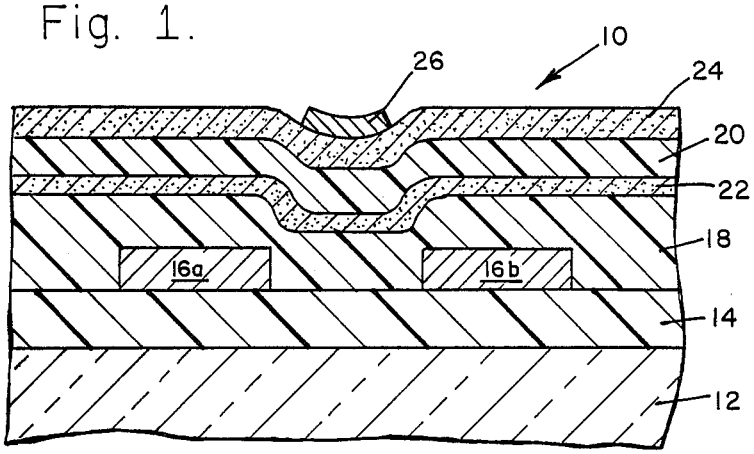
FIG. 1 is a cross-sectional view of the solid state, variable resistance device of the invention.

Referring now to the drawings, FIG. 1 is a schematic cross-sectional view of the device 10 of invention, which is a gate-controlled, variable resistor with memory. As shown in FIG. 1, a substrate 12 is provided with an insulating layer 14.

The material comprising the insulating layer 14 may be any of the well-known insulating materials, such as silicon dioxide ($SiO_2$), whether in the form of quartz or glass. Examples of other suitable materials include alumina ($Al_2O_3$) (ceramic or sapphire), magnesia (MgO), and the like.

The substrate 12 may comprise a separate material, such as silicon, with an insulating layer 14 of silicon dioxide formed thereover. Alternatively, the substrate 12 and the insulating layer 14 may comprise the same material, such as glass or alumina.

The thickness of the insulating layer 14 is not critical, other than it not be so thin as to lose its insulating properties. In the case of silicon dioxide, a thickness of about 1 $\mu$m is adequate.

The insulating layer 14 may be formed by any of the processes well-known in the prior art. For example, a layer 1 $\mu$m thick of $SiO_2$ may be conveniently formed on a clean silicon substrate by wet oxidation reaction of hydrogen gas and oxygen gas at about 800° to 1,000° C.

A pair of metal contact electrodes, also called read electrodes, 16a, 16b is deposited on the insulating layer 14. Any common metal electrode material may be employed in the practice of the invention. Examples of suitable electrode materials include nickel, gold, platinum, aluminum, titanium, palladium and tungsten. Indeed, any of the well-known metals, other than those which migrate under the influence of an electric field, may be utilized in the practice of the invention.

The thickness of the metal contact electrodes 16a, 16b is not critical, other than it be thick enough to efficiently conduct current without undue losses.

A layer 18 of a transition metal oxide is then deposited over the electrodes 16a, 16b and therebetween. Any of the transition metal oxides in which the transition metal occupies Rows 3, 4, and 5 of the Periodic Table may be used in the practice of the invention, subject to possessing the requisite properties discussed below. The transition metals include Sc, Ti, V, Cr, Mn, Fe, Co, Ni, Cu, Zn, Y, Zr, Nb, Mo, Tc, Ru, Rh, Pd, Ag, Cd, La, Hf, Ta, W, Re, Os, Ir, Pt, Au, and Hg. In particular, the transition metal oxides in which the transition metal is one of V, Zr, Nb, Mo, Ru, Rh, W, and Ir are preferred.

The selection of the transition metal oxide is constrained by its resistivity change as a function of ionic association. An example of a particularly preferred transition metal oxide, tungsten trioxide ($WO_3$), will serve to demonstrate this constraint.

In the case of tungsten trioxide, its resistivity can be reversibly altered over several orders of magnitude by adjusting the hydrogen ion content of the material. The reversible electrochemical reaction mechanism is give by $$WO_3 + xH^+ + xe^- \rightleftharpoons H_xWO_3$$

The maximum amount of hydrogen ion associated with tungsten oxide is given by $H_xWO_3$, where $x \approx 0.33$.

Since ON/OFF states of the device 10 are used, a change of three to four orders of magnitude in resistivity is desirable, although the change in resistivity may be lower or higher, depending on specific materials, device configuration, and applications.

As deposited, a tungsten trioxide film having a thickness of about 0.2 to 0.3 μm is an insulator, having a resistivity of about $10^5$ to $10^6$ ohm-cm. Incorporation of about 33 at.% $H^+$ changes the resistivity to about 10 to 100 ohm-cm.

The thickness of the variable resistance layer 18 is determined by the required dynamic resistance range and the switching time. In general, thinner layers provide higher resistance and faster switching times.

The variable resistance layer 18 may be formed by any of the well-known deposition methods, such as sputtering, e-beam evaporation, etc. Examples of other variable resistance materials suitably employed in the practice of the invention include iridium oxide ($Ir_2O_3$), molybdenum oxide ($MoO_3$), zirconium oxide ($ZrO_2$) and rhodium oxide ($RhO_2$).

An ion source, or donor, layer 20 which acts as a source of ions is next formed over the variable resistance layer 18. The ion source layer 20 is a reservoir of ions, preferably monovalent ions. Examples of suitable monovalent ions used in the practice of the invention include $H^+$, $Na^+$, $Li^+$, and $Ag^+$.

Hydrogen ions, which are the smallest ions and thus the easiest to use, are generated by field dissociation of water. Accordingly, the ion source layer 20 should be hygroscopic to act as a source of $H^+$. Examples of suitable $H^+$ donor materials include $Cr_2O_3$, $ZrO_2$, $Ta_2O_5$, $V_2O_5$, $TiO_2$, SiO, $SiO_2$, LiF, and $MgF_2$. Alternatively, there are also several organic materials which would provide the desired hygroscopicity. An example of such a material is Nafion, a trade name of DuPont de Nemours (Milwaukee, WI), which is a perfluoro sulfonate polymer. Such a material may be spin-coated over the variable resistance layer 18 and dried, similar to the formation of resist layers used in lithography in semiconductor processing.

A material having a higher hygroscopicity is desired, in order to achieve faster switching times. Consequently, $Cr_2O_3$ is a presently preferred material.

For other sources of ions, LiF serves as a source of $Li^+$ ions, $Na_2WO_3$ serves as a source of $Na^+$ ions, and $RbAg_4I_5$ serves as a source of $Ag^+$ ions. Based on the foregoing, other sources of suitable ions will be apparent to those skilled in the art.

The thickness of the ion source layer 20 is constrained by being thick enough to provide an adequate source of ions for device operation (described below), yet not so thick as to create adhesion problems. Further, if the ion source layer 20 is too thick, too high a field will be required to drive the ions. In the case of $Cr_2O_3$, a thickness ranging from about 0.1 to 0.2 μm is suitable.

Any of the well-known processes for forming thin layers of oxides and halides, such as those materials indicated above, may be used in the practice of the invention. For example, chromium trioxide may be formed by reactive magnetron sputtering.

An intervening layer 22 of an insulating material is optionally interposed between the variable resistance layer 18 and the ion donor layer 20. Examples of suitable insulating materials include silicon monoxide (SiO), silicon dioxide ($SiO_2$), $Al_2O_3$, and MgO.

The insulating layer 22 of SiO acts as a non-linear blocking barrier through which ions may pass, impelled by an electrical field. That is, ions can be driven across the layer 22 in either direction only under a sufficiently high electric field, rather than by local fields only. The insulating layer 22 may also have properties as an ion donor, although not as rich a source as, for example, $Cr_2O_3$.

The presence of the insulating layer 22 prevents the variable resistance layer 18, for example, $WO_3$, from being shorted out by intimate contact with the $Cr_2O_3$ ion donor layer 20, and thus permits controllability of ion donation and resulting resistivity.

If the resistance of layer 20 is sufficiently greater than that of layer 18, then layer 22 may not be required. However, in the case of a $WO_3/Cr_2O_3$ combination, the resistivity of the ion donor layer 20 is low (e.g., about $10^2$ ohm-cm) compared to the variable resistance layer 18 (nominally $10^5$ to $10^6$ ohm-cm as deposited) as to require the presence of the insulating layer 22.

On the other hand even if the resistance difference does not require the presence of layer 22, it still may be desirable to include this layer, since it will serve to block local (internal) fields from driving ions from layer 20 to layer 18 or vice versa.

The thickness of the insulating layer 22 ranges from about 500 to 1,000 Å and is a compromise between the desire to provide adequate isolation, while at the same time permitting ionic transfer between layers 18 and 20 under reasonable applied field conditions.

A second insulating layer 24 is placed on top of the donor layer 20. Conveniently, the same material used for forming the first insulating layer 22 is employed. Thus, for example, in sequential depositions in one chamber, only one source is required for both layers 22 and 24. The second insulating layer 24 isolates a subsequently-deposited gate metal from the donor layer 20.

The thickness of the second insulating layer 24 is also about 500 to 1,000 Å. As with the first insulating layer 22, too thick a layer would require excessive applied fields to operate the device efficiently.

A metallic gate (also called the write electrode) 26 is deposited on the second insulating layer 24, aligned over the contacts 16a, 16b. The metallic gate 26 may be aligned between the contacts 16a, 16b, or extending across from one contact to the other, or split. Placement of the gate 26 is dictated by the given application.

Examples of suitable metallic gate materials include aluminum, gold, silver, tungsten, palladium, platinum, and nickel. Other contact materials wellknown in the semiconductor industry, such as polysilicon, appropriately doped, may also be used.

As illustrated in FIG. 1, the gate 26 may be formed of a single layer of metal, such as those listed above. Alternatively, a multilayer stack of any combination of the foregoing metals, along with other metals such as titanium and chromium, may be employed to improve resistance to degradation from hydrogen ions, and to enhance durability, compatibility, etc.

As indicated above, the two insulating layers 22, 24 serve essentially as blocking contacts, allowing only desired ionic or electronic current to pass through, and that only when gate control voltage is present and is of sufficient magnitude.

The assembly depicted in FIG. 1 comprises the solid state, variable resistance device 10. Its operation is now described.

It will be appreciated that the device 10 operates analogously to a field effect transistor (FET), but with a memory. When a positive voltage is applied to the gate 26, with respect to one or both of the read electrodes 16a, 16b, the electrical field generated causes ions to flow from the ion donor layer 20 to the variable resistance layer 18. If the ion donor layer 20 is hygroscopic, such as $Cr_2O_3$, the electric field ionizes the $H_2O$ present in the $Cr_2O_3$ layer 20, and drives the positive hydrogen (H+) ions towards the negative contact 16a and/or 16b, into the variable resistance layer 18, such as $WO_3$. There, the ions neutralize, forming $H_xWO_3$, as indicated above. This decreases the resistivity of the tungsten trioxide layer 18 proportionately to the quantity of ions absorbed. The decreased resistivity, or increased conductivity, of the tungsten trioxide layer 18 allows current to flow from one electrode 16a to the other electrode 16b, during the read process.

The process may be reversed by applying a negative signal to the gate 26, whereupon the $H_xWO_3$ is dissociated in layer 18, and the hydrogen ions pulled back into the $Cr_2O_3$ layer 20, increasing the resistivity of the $WO_3$ layer 18. As a consequence, current flow between the two electrodes 16a and 16b is decreased during the read process.

Once the level of hydrogen ions in the $Cr_2O_3$ layer 20 is set by the voltage on the gate 26, the device 10 is stable; that is, the level of $H_xWO_3$ remains the same even when the gate voltage is removed. Thus the resistance of the device 10 stays fixed until gate potential is applied again.

The operation of writing comprises applying a voltage to the gate 26 with respect to one or both of the read electrodes 16a, 16b. For example, if the variable resistance layer 18 comprises $WO_3$ and the hydrogen donor layer 20 comprises $Cr_2O_3$, the gate 26 is biased positive with respect to one of the electrodes to drive H+ ions from layer 20 to layer 18 and is biased negative to drive ions from layer 18 to layer 20. The result is to change the resistance of the variable resistance layer in a non-volatile fashion. Once the gate voltage is removed, the status of the ions remains fixed, and the device 10 stays in whatever state it has been brought.

The operation of reading relies on the use of electrodes 16a and 16b comprising two terminals of a single resistance device, depending on the resistance of the variable resistance layer 18. The read voltage is considerably smaller than the write voltage on the gate 26. For example, the read voltage on the two electrodes 16a, 16b may be 1 V or less, while the write voltage on the gate 26 may be 10 to 15 V, or over an order of magnitude greater.

To use the device 10 as a binary EPROM, the resistance between the contacts 16a, 16b is varied by applying the proper positive gate voltage on the gate 26 and then removing the voltage. The variable resistance device acts as the switching element in the synapse matrix of a neural network; the ON state may be represented by a lower resistance, while the OFF state may be represented by a higher resistance, for example. The presence of one state, typically the ON state, denotes a stored bit, which is non-volatile and will stay stored as long as desired. If the stored bit is to be removed, a negative polarity signal is applied to the gate 26 until the OFF state is attained. As with an EPROM, an entire section of memory may be erased by connecting the gates 26 simultaneously to the negative voltage. Stored bits may be selectively erased by individual gate signals; or selected groups of gates representing a word may be erased together once identified.

INDUSTRIAL APPLICABILITY

The solid state, variable resistance device of the invention is useful in a variety of applications, including use in neural networks, as well as any kind of adaptive circuitry which would benefit from feedback error signals in process control.

EXAMPLE

In one embodiment, the device 10 comprised nickel contact electrodes 16 about 1,300 Å thick and about 60 μm wide, separated by about 60 μm, formed on a silicon dioxide insulating layer 14 about 1 μm thick, in turn formed on a silicon substrate 12. The $SiO_2$ layer 14 was formed by wet oxidation at about 1000° C. The nickel contact electrodes were formed by DC sputtering. Next, layer 18 comprised $WO_3$, about 0.3 μm thick, and formed by conventional thermal evaporation. The $WO_3$ layer 18 was overlaid with a first SiO layer 22 about 500 Å thick, formed by thermal evaporation. Donor layer 20 comprised $Cr_2O_3$, about 1.6 μm thick, formed by reactive magnetron sputtering, using a chromium target and conventional process parameters. The donor layer 20 was overlaid with a second SiO layer 24 about 800 Å thick, formed in the same manner as the first SiO layer 22. Finally, a gate electrode 26 of aluminum, having a thickness of about 1,000 Å, was formed on the second SiO layer 24, approximately midway between the two electrodes 16a and 16b.

Figure 2:
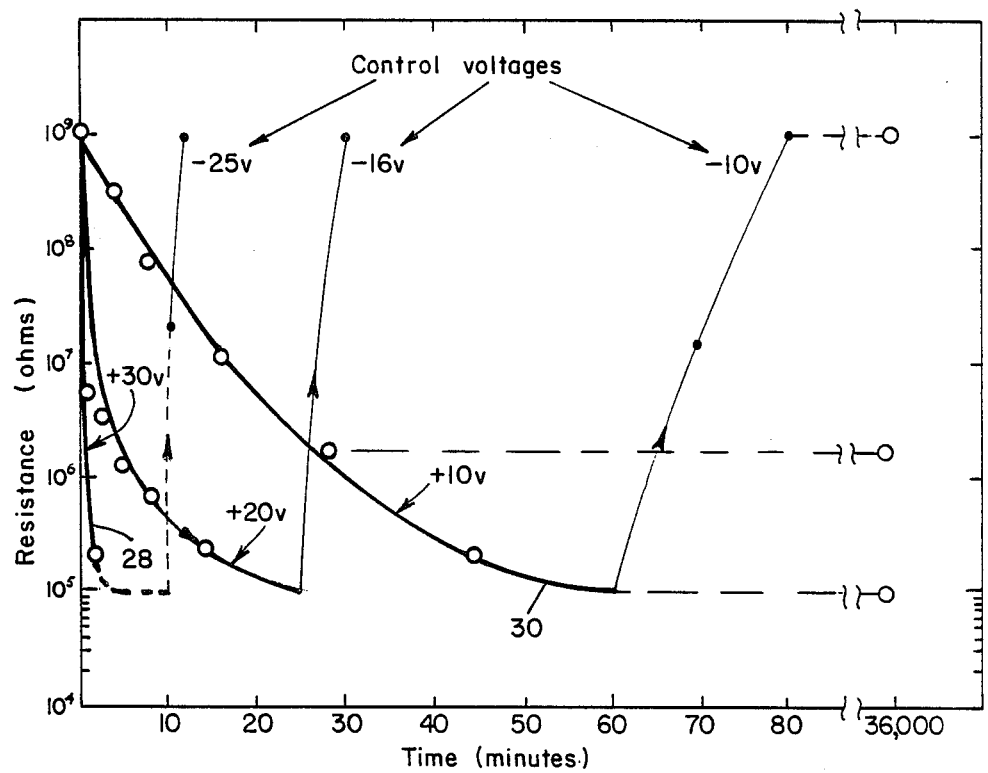
FIG. 2, on coordinates of resistance (in ohms) and time (in minutes), depicts the times required to change resistance values with different control voltages and the stability of the resistance value, once set.

FIG. 2 illustrates the times required to change resistance values and the stability of the resulting resistance value, once set, for the device 10 prepared above. The greater the magnitude of gate control voltage, the faster the change of resistance. A gate voltage of over 30 volts (Curve 28) accomplished a change in resistance of well over three orders of magnitude in less than one minute; whereas a control signal of 10 volts (Curve 30) required about one hour for the same change in resistance. It is anticipated that these times will be significantly reduced as the device 10 is optimized.

The zero voltage values at the extreme right of FIG. 2 illustrate the high stability of the device 10, subsequent to removal of gate voltage at intermediate values of resistance. Excellent stability after 600 hours is seen in FIG. 2.

Thus, there has been provided a solid state, variable resistance device, adapted for use with neural networks. It will be clear to one skilled in the art that various changes and modifications of an obvious nature may be made, and all such changes and modifications are considered to fall within the scope of the invention, as defined by the appended claims.

What is claimed is:

1. A solid state, non-volatile electrically programmable reversible variable resistance device comprising:
   (a) a pair of contact electrodes formed on an insulating surface;
   (b) a variable resistance layer comprising a material having a resistivity controllable by adjusting ion content thereof and physically contacting said pair of electrodes;
   (c) a blocking layer comprising a non-linear blocking barrier formed on said variable resistance layer;
   (d) a donor layer comprising an ion donor material for adjusting said ion content of said variable resistance material, said donor layer formed on said blocking layer; and
   (e) a gate electrode for generating an electric field to control flow of ions between said ion donor material and said variable resistance material, said gate electrode formed on said donor layer.

2. The device of claim 1 wherein said non-linear blocking barrier comprises a material selected from the group consisting of silicon monoxide, silicon dioxide, alumina, and magnesia.

3. The device of claim 2 wherein said non-linear blocking barrier consists essentially of silicon monoxide and has a thickness ranging from about 500 to 1,000 Å.

4. The device of claim 1 further including a layer comprising an insulating material interposed between said ion donor material and said gate.

5. The device of claim 4 wherein said insulating material comprises a material selected from the group consisting of silicon monoxide, silicon dioxide, alumina, and magnesia.

6. The device of claim 5 wherein said insulating material consists essentially of silicon monoxide and has a thickness ranging from about 500 to 1,000 Å.

7. The device of claim 1 wherein said insulating surface comprises a material selected from the group consisting of $SiO_2$, $Al_2O_3$, and MgO.

8. The device of claim 7 wherein said insulating surface comprises silicon dioxide, formed on a substrate of silicon.

9. The device of claim 1 wherein said pair of contact electrodes comprises a material selected from the group consisting of nickel, gold, platinum, aluminum, titanium, palladium, and tungsten.

10. The device of claim 1 wherein said variable resistance layer comprises a material selected from the group consisting of the transition metal oxides which evidence a change in resistivity as a function of associated ion content.

11. The device of claim 10 wherein said transition metal oxide comprises an oxide of a transition metal selected from the group consisting of V, Zr, Nb, Mo, Ru, Rh, W, and Ir.

12. The device of claim 11 wherein said variable resistance layer comprises a transition metal oxide selected from the group consisting of tungsten trioxide, iridium oxide, molybdenum oxide and rhodium oxide.

13. The device of claim 12 wherein said variable resistance material consists essentially of tungsten trioxide and has a thickness of about 0.2 to 0.3 $\mu$m.

14. The device of claim 1 wherein said ions are selected from the group consisting of $H^+$, $Na^+$, $Li^+$, and $Ag^+$.

15. The device of claim 14 wherein said ions are hydrogen ions and said donor layer comprises a material selected from the group consisting of chromium trioxide, zirconium oxide, tantalum pentoxide, vanadium pentoxide, titanium dioxide, silicon monoxide, silicon dioxide, lithium fluoride, magnesium fluoride and hydroscopic polymers.

16. The device of claim 15 wherein said donor layer consists essentially of chromium trioxide and has a thickness ranging from about 0.1 to 0.2 $\mu$m.

17. The device of claim 1 wherein said gate electrode comprises a metal selected from the group consisting of aluminum, gold, silver, tungsten, palladium, platinum, titanium, chromium, and doped polysilicon.

18. A solid state, non-volatile electrically programmable reversible variable resistance device comprising:
   (a) a pair of contact electrodes formed on an insulating surface;
   (b) a variable resistance layer comprising a material having a resistivity controllable by adjusting hydrogen ion content thereof and physically contacting said pair of electrodes, said variable resistance layer comprising a material selected from the group consisting of tungsten trioxide, iridium oxide, molybdenum oxide and rhodium oxide;
   (c) a layer comprising a non-linear blocking barrier;
   (d) a donor layer comprising a hygroscopic, hydrogen ion donor material for adjusting said ion content of said variable resistance material, said donor layer comprising a material selected from the group consisting of chromium trioxide, zirconium oxide, tantalum pentoxide, vanadium pentoxide, titanium dioxide, silicon monoxide, silicon dioxide, lithium fluoride, magnesium fluoride and hygroscopic polymers;
   (e) a layer comprising an insulating material; and
   (f) a gate electrode for generating an electric field to control flow of ions between said ion donor material and said variable resistance material.

19. The device of claim 18 wherein said non-linear blocking barrier comprises a material selected from the group consisting of silicon monoxide, silicon dioxide, alumina, and magnesia.

20. The device of claim 19 wherein said non-linear blocking barrier consists essentially of silicon monoxide and has a thickness ranging from about 500 to 1,000 Å.

21. The device of claim 18 wherein said insulating material comprises a material selected from the group consisting of silicon monoxide, silicon dioxide, alumina, and magnesia.

22. The device of claim 21 wherein said insulating material consists essentially of silicon monoxide and has a thickness ranging of about 500 to 1,000 Å.

23. The device of claim 18 wherein said insulating surface comprises a material selected from the group consisting of $SiO_2$, $Al_2O_3$, and MgO.

24. The device of claim 23 wherein said insulating surface comprises silicon dioxide, formed on a substrate of silicon.

25. The device of claim 18 wherein said pair of contact electrodes comprises a material selected from the group consisting of nickel, gold, platinum, aluminum, titanium, palladium, and tungsten.

26. The device of claim 18 wherein said variable resistance material consists essentially of tungsten trioxide and has a thickness of about 0.2 to 0.3 $\mu$m.

27. The device of claim 18 wherein said donor layer consists essentially of chromium trioxide and has a thickness ranging from about 0.1 to 0.2 $\mu$m.

28. The device of claim 18 wherein said gate electrode comprises a metal selected from the group consisting of aluminum, gold, silver, tungsten, palladium, platinum, titanium, chromium, and doped polysilicon.

29. A solid state, non-volatile electrically programmable reversible variable resistance device comprising:
(a) a pair of contact electrodes formed on an insulating surface consisting essentially of silicon dioxide, formed on a substrate of silicon;
(b) a variable resistance layer comprising a material having a resistivity controllable by adjusting hydrogen ion content thereof and physically contacting said pair of electrodes, said variable resistance layer comprising a material selected from the group consisting of tungsten trioxide;
(c) a layer comprising a non-linear blocking barrier consisting essentially of silicon monoxide;
(d) a donor layer comprising a hygroscopic, hydrogen ion donor material for adjusting said ion content of said variable resistance material, said donor layer consisting essentially of chromium trioxide;
(e) a layer comprising an insulating material consisting essentially of silicon monoxide; and
(f) a gate electrode for generating an electric field to ionize water in said ion donor material and to control flow of ions between said ion donor material and said variable resistance material.

30. The device of claim 29 wherein said non-linear blocking barrier has a thickness ranging from about 500 to 1,000 Å.

31. The device of claim 29 wherein said insulating material has a thickness ranging from about 500 to 1,000 Å.

32. The device of claim 29 wherein said pair of contact electrodes comprises a material selected from the group consisting of nickel, gold, platinum, aluminum, titanium, palladium, and tungsten.

33. The device of claim 29 wherein said variable resistance material has a thickness of about 0.2 to 0.3 $\mu$m.

34. The device of claim 29 wherein said donor layer has a thickness ranging from about 0.1 to 0.2 $\mu$m.

35. The device of claim 29 wherein said gate electrode comprises a metal selected from the group consisting of aluminum, gold, silver, tungsten, palladium, platinum, titanium, chromium, and doped polysilicon.

* * * * *